(12) United States Patent
Rijssemus et al.

(10) Patent No.: US 12,483,200 B2
(45) Date of Patent: Nov. 25, 2025

(54) AMPLIFIER DEVICE

(71) Applicant: TECHNETIX B.V., Veenendaal (NL)

(72) Inventors: Martien Rijssemus, Veenendaal (NL); Matthijs Laro, Veenendaal (NL); Dries Roodbeen, Veenendaal (NL)

(73) Assignee: TECHNETIX B.V., Veenendaal (NL)

( * ) Notice: Subject to any disclaimer, the term of this patent is extended or adjusted under 35 U.S.C. 154(b) by 436 days.

(21) Appl. No.: 18/019,077

(22) PCT Filed: Jul. 27, 2021

(86) PCT No.: PCT/EP2021/070954
§ 371 (c)(1),
(2) Date: Jan. 31, 2023

(87) PCT Pub. No.: WO2022/083909
PCT Pub. Date: Apr. 28, 2022

(65) Prior Publication Data
US 2023/0283242 A1  Sep. 7, 2023

(30) Foreign Application Priority Data

Oct. 22, 2020  (GB) ....................... 2016781
Mar. 16, 2021  (GB) ....................... 2103614

(51) Int. Cl.
H03F 1/26    (2006.01)
H03F 3/62    (2006.01)

(52) U.S. Cl.
CPC ................ *H03F 1/26* (2013.01); *H03F 3/62* (2013.01); *H03F 2200/165* (2013.01);
(Continued)

(58) Field of Classification Search
CPC ........ H03F 1/26; H03F 3/62; H03F 2200/165; H03F 2200/171; H03F 2200/192; H03F 2200/204; H03F 2200/63; H04N 7/102
(Continued)

(56) References Cited

U.S. PATENT DOCUMENTS 5,742,416 A * 4/1998 Mizrahi ............ H04B 10/2912
                                                    398/91
6,751,414 B1 * 6/2004 Davies ............... H04B 10/2563
                                                    398/41
9,628,752 B2   4/2017 Urban

FOREIGN PATENT DOCUMENTS

GB      2523332 A    8/2015
GB      2568275 A    5/2019
(Continued)

Primary Examiner — Hieu P Nguyen
(74) Attorney, Agent, or Firm — SZDC Law PC

(57) ABSTRACT

There is provided an amplifier device comprising a first directional coupler (12: 30, 32) and a second directional coupler (14: 30', 32') connected together so as to create separate upstream (16) and downstream (18) paths in which amplifier means (24, 24') are located, wherein the first and second directional couplers (12, 14: 30, 32; 30', 32') are configured to have different signal loss characteristics, one of the directional couplers having low signal loss characteristics for upstream signals and the other directional coupler having low signal loss characteristics for downstream signals. The signal loss characteristics are preferably the coupling loss of each directional coupler (12, 14: 30, 32; 30', 32'). The first and second directional couplers may each comprise a microstrip directional coupler (30; 30') connected to a ferrite directional coupler (50; 50').

8 Claims, 1 Drawing Sheet

(52) U.S. Cl.
CPC .. *H03F 2200/171* (2013.01); *H03F 2200/192* (2013.01); *H03F 2200/204* (2013.01); *H03F 2200/63* (2013.01)

(58) Field of Classification Search
USPC ...................................... 330/295, 124 R, 286
See application file for complete search history.

(56) References Cited

FOREIGN PATENT DOCUMENTS

| | | |
|---|---|---|
| JP | H0897763 A | 4/1996 |
| WO | 2020072261 A1 | 4/2020 |

\* cited by examiner

AMPLIFIER DEVICE

This application is the National Stage Application of PCT/EP2021/070954, filed on Jul. 27, 2021, which claims priority to United Kingdom Patent Application Nos. GB 2016781.3, filed on Oct. 22, 2020, and GB 2103614.0, filed on Mar. 16, 2021, all of which are incorporated by reference for all purposes as if fully set forth herein.

FIELD OF THE INVENTION

This invention relates to an amplifier device for use in cable television and broadband networks.

BACKGROUND TO THE INVENTION

In a broadband network, amplifiers are used to amplify electrical signals from a central network head end down to an individual user (downstream) or from the individual user back to the head end (upstream). In the past the upstream and downstream frequencies were separated in frequency range, the upstream signals using a lower frequency range and the downstream signals using a higher frequency range.

In modern networks, frequency ranges are often altered to give homes an ever faster, greater bandwidth, upstream signal and as such amplifier devices without diplex filters are advantageous so that an expensive upgrade to change the diplex filters is no longer needed when frequency ranges alter.

Amplifier devices without diplex filters use directional couplers instead to create a bi-directional amplifier device. These amplifier devices can incorporate a low-pass filter in an upstream amplifier path to increase isolation above a low-pass frequency. However problems can be encountered with the amount of noise in the upstream signal.

SUMMARY OF THE INVENTION

In accordance with the present invention, there is provided an amplifier device comprising a first directional coupler and a second directional coupler connected together so as to create separate upstream and downstream paths in which amplifier means are located, wherein the first and second directional couplers are configured to have different signal loss characteristics, one of the directional couplers having low signal loss characteristics for upstream signals and the other directional coupler having low signal loss characteristics for downstream signals.

Thus typically the first directional coupler is configured to have a low signal loss for the signal frequency of the downstream signal and the second directional coupler is configured to have a low signal loss for the signal frequency of the upstream signal, so ensuring the in-to-out coupling of each directional coupler can be optimised. By having different loss characteristics for the first and second directional couplers, the upstream signal has improved signal quality compared to using first and second directional couplers with the same loss characteristics.

Preferably the loss characteristics are coupling loss of the respective directional couplers, so allowing the coupling loss of each directional coupler to be selected dependent on signal frequency Preferably a signal frequency of the upstream signals is different to a signal frequency of the downstream signals.

The first and second directional couplers may each comprise a microstrip directional coupler.

The first and second directional couplers may preferably each comprise a microstrip directional coupler connected to a ferrite directional coupler, thus providing a first directional coupler comprising a first microstrip directional coupler connected to a first ferrite directional coupler and a second directional coupler comprising a second microstrip directional coupler connected to a second ferrite directional coupler. For such an arrangement preferably the first and second directional couplers are arranged such that a coupled port of the first microstrip directional coupler is connected to the second ferrite directional coupler to create the separate downstream signal path. Preferably a coupled port of the second microstrip directional coupler is connected to the first ferrite directional coupler to create the separate upstream signal path.

The or a first amplifier means is preferably located between the coupled port of the first microstrip directional coupler and the output port of the second ferrite directional coupler so as to amplify the downstream signal. The or a second amplifier means is preferably located between the coupled port of the second microstrip directional coupler and the output port of the first ferrite directional coupler so as to amplify the upstream signal.

The invention will now be described by way of example with reference to the following drawings in which.

DESCRIPTION

Figure 1:
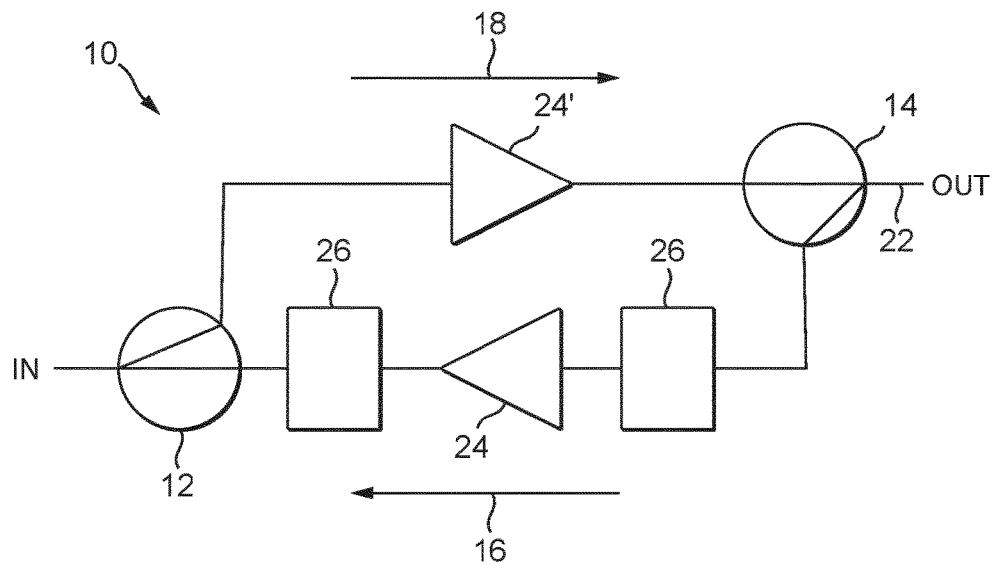
FIG. 1 is a schematic diagram of a first embodiment of an amplifier device.
Figure 2:
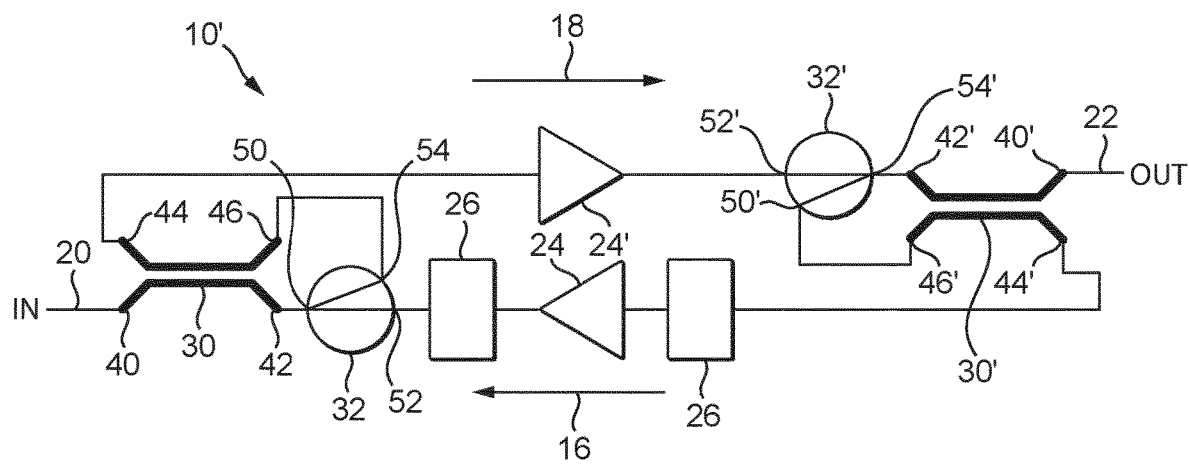
FIG. 2 is a schematic diagram of a second embodiment of an amplifier device.

FIGS. 1 and 2 show two versions of an amplifier device 10, 10' using two directional couplers to create separate upstream and downstream signal paths in which amplifier elements are located. The amplifier devices 10, 10' are bi-directional allowing upstream and downstream signals to pass between the user and a headend associated with the network provider.

In FIG. 1, first and second directional couplers 12, 14 are connected together to create separate upstream and downstream signal paths 16, 18 between ports 20, 22 with an amplifier element 24, 24' disposed in each signal path. Optional low pass filters 26 are placed in signal path 16 either side of amplifier element 24.

In FIG. 2, the first and second directional couplers each consist of a microstrip directional coupler 30, 30' in combination with a ferrite transformer directional coupler 32, 32' to create separate upstream and downstream signal paths 16, 18. Thus first microstrip directional coupler 30 is connected to first ferrite transformer directional coupler 32 to create a first directional coupler and second microstrip directional coupler 30' is connected to second ferrite transformer directional coupler 32' to create a second directional coupler.

Each microstrip directional coupler 30, 30' consists of an input port 40, 40' output port 42, 42', coupled port 44, 44' and isolation port 46, 46'. Ferrite directional couplers 32, 32' consist of input port 50, 50', output port 52, 52' and coupled port 54, 54'.

Coupled port 44 of microstrip directional coupler 30 connects to port 52' of ferrite directional coupler 32' to create downstream path 18, with amplifier element 24' disposed between ports 44 and 52'. Similarly coupled port 44' of microstrip directional coupler 30' connects to port 52 of ferrite directional coupler 32 which is in turn connected to output 42 of microstrip directional coupler 30 to create upstream path 16 in which is disposed amplifier element 24.

Thus the first and second directional couplers are coupled together to form the separate unidirectional upstream and downstream paths 18, 16.

The directional couplers 12, 14, 30 combined with 32, 30' combined with 32', are selected to have different loss characteristics depending on whether they receive an upstream signal for transmission along upstream signal path 16 or a downstream signal for transmission along downstream signal path 18. Typically downstream frequencies are likely to be 1, 1.2, or 1.8 GHz with upstream frequencies typically around 700 MHz. Thus the loss characteristics of first directional coupler 12, 30 combined with 32, and in particular the coupled loss characteristics, are configured to be low loss for the highest downstream signal frequency, typically 1, 1.2 or 1.8 GHz, and the loss characteristics of second directional coupler 14, 30' combined with 32', and in particular the coupled loss characteristics, are configured to have a low loss for the highest upstream signal frequency, typically 700 MHz.

By having different loss characteristics for the first and second directional couplers, the downstream and upstream signals leaving ports 22, 20 have improved signal quality compared to using first and second directional couplers with the same loss characteristics. The coupled signal loss at directional coupler 14, 30' combined with 32' at low frequencies will be lower, thus increasing the upstream signal gain and decreasing the noise figure in the upstream signal path. This is beneficial as a better noise figure improves upstream signal quality greatly. At the same time the in-to-out insertion loss of directional coupler 14, 30' combined with 32' will change only minimally in the downstream frequency range and thus will not impair the downstream signal quality.

The invention claimed is:

1. An amplifier device comprising a first directional coupler and a second directional coupler connected together so as to create separate upstream and downstream paths in which at least one amplifier element is located, wherein the first and second directional couplers are configured to have different signal loss characteristics, one of the directional couplers having low signal loss characteristics for upstream signals and the other directional coupler having low signal loss characteristics for downstream signals,
wherein the first and second directional couplers each comprise a microstrip directional coupler.

2. An amplifier device according to claim 1, wherein the signal loss characteristics are coupling loss of a directional coupler.

3. An amplifier device according to claim 1, wherein a signal frequency of the upstream signals is different to a signal frequency of the downstream signals.

4. An amplifier device according to claim 1, wherein the first and second directional couplers each further comprise a ferrite directional coupler connected to the microstrip directional coupler.

5. An amplifier device according to claim 4, wherein a coupled port of the first microstrip directional coupler is connected the second ferrite directional coupler to create the separate downstream signal path.

6. An amplifier device according to claim 4, wherein a coupled port of the second microstrip directional coupler is connected to the first ferrite directional coupler to create the separate upstream signal path.

7. An amplifier device according to claim 4, wherein a first amplifier element is located between the coupled port of the first microstrip directional coupler and the output port of the second ferrite directional coupler.

8. An amplifier device according to claim 7, wherein a second amplifier element is located between the coupled port of the second microstrip directional coupler and the output port of the first ferrite directional coupler.

* * * * *